US006010917A

United States Patent [19]

Alwan et al.

[11] Patent Number: 6,010,917

[45] Date of Patent: Jan. 4, 2000

[54] ELECTRICALLY ISOLATED INTERCONNECTS AND CONDUCTIVE LAYERS IN SEMICONDUCTOR DEVICE MANUFACTURING

[75] Inventors: James J. Alwan; Kevin Tjaden; David A. Cathey, all of Boise, Id.

[73] Assignee: Micron Technology, Inc., Boise, Id.

[21] Appl. No.: 08/725,646

[22] Filed: Oct. 15, 1996

[51] Int. Cl.[7] ...................... H01L 21/00

[52] U.S. Cl. ...................... 438/20; 445/24

[58] Field of Search ...................... 438/20, 28; 445/24, 445/50; 216/11, 88; 313/336, 351

[56] References Cited

U.S. PATENT DOCUMENTS

| | | | |
|---|---|---|---|
| 4,940,916 | 7/1990 | Borel et al. | 313/306 |
| 5,162,704 | 11/1992 | Kobori et al. | 315/349 |
| 5,186,670 | 2/1993 | Doan et al. | 445/24 |
| 5,194,344 | 3/1993 | Cathey, Jr. et al. | 430/5 |
| 5,194,346 | 3/1993 | Rolfson et al. | 430/5 |
| 5,205,770 | 4/1993 | Lowrey et al. | 445/24 |
| 5,210,472 | 5/1993 | Casper et al. | 315/349 |
| 5,212,426 | 5/1993 | Kane | 316/169.1 |
| 5,229,331 | 7/1993 | Doan et al. | 437/228 |
| 5,232,549 | 8/1993 | Cathey et al. | 456/633 |
| 5,259,799 | 11/1993 | Doan et al. | 445/24 |
| 5,283,500 | 2/1994 | Kochanski | 315/58 |
| 5,372,973 | 12/1994 | Doan et al. | 437/228 |
| 5,653,619 | 8/1997 | Cloud et al. | 445/24 |
| 5,683,282 | 11/1997 | Liu et al. | 445/50 |

OTHER PUBLICATIONS

Lee, Kon Jiun, "Current Limiting of Field Emitter Array Cathodes," thesis, Georgia Institute of Technology, 1986.

Yokoo et al., "Active Control of Emission Current of Field Emitter Array," *Revue "Le Vide, les couches Minces"*—Supplement au No. 271—Mar.–Apr. 1994, pp. 58–61.

Cathey Jr., David A., "Field Emission Displays," Micron Display Technology, Inc. Technical Paper.

*Primary Examiner*—Tuan H. Nguyen
*Attorney, Agent, or Firm*—Dorsey & Whitney LLP

[57] ABSTRACT

A method for fabricating microelectronic deices in which an interconnect layer is electrically isolated from large protuberances that project from a lower conductive layer to a desired endpoint of a chemical-mechanical planarization process. The lower conductive layer is covered with an insulating material to form an insulator layer that generally follows the contour of the lower conductive layer and any large protuberances. A highly conductive interconnect material is then deposited over the insulator layer to form an interconnect layer that generally follows the contour of the insulator layer. The interconnect layer may be deposited directly on the insulator layer, or it may be deposited on an intermediate layer between the interconnect layer and the insulator layer. After the upper conductive layer is deposited, the insulator layer and the upper conductive layer are planarized with a chemical-mechanical planarization process to a desired endpoint.

6 Claims, 5 Drawing Sheets

ELECTRICALLY ISOLATED INTERCONNECTS AND CONDUCTIVE LAYERS IN SEMICONDUCTOR DEVICE MANUFACTURING

TECHNICAL FIELD

The present invention relates to interconnects and conductive layers in microelectronic devices, and more particularly, to fabricating interconnects and conductive layers that are electrically isolated from large protuberances that project from a lower conductive layer.

BACKGROUND OF THE INVENTION

Microelectronic devices are small, complex electronic devices manufactured on a substrate made from glass or a suitable semiconductive material (e.g., silicon) on a suitable insulating material (e.g., glass). A typical microelectronic device has many small components formed in multiple layers of materials. One type of microelectronic device particularly relevant to the present invention is a field emission display ("FED").

FEDs are one type of flat panel display in use or proposed for use in computers, television sets, camcorder viewfinders, and a variety of other applications. FEDs have a baseplate with a generally planar emitter substrate juxtaposed to a faceplate. FIG. 1 illustrates a portion of a conventional FED baseplate 20 with a conductive emitter substrate 30, and a number of emitters 32 formed on the emitter substrate 30. An insulator layer 40 made from a dielectric material is disposed on the emitter substrate 30, and an extraction grid 50 made from polysilicon is disposed on the on the insulator layer 40. A number of cavities 42 extend through the insulator layer 40, and a number of holes 52 extend through the extraction grid 50. The cavities 42 and the holes 52 are aligned with the emitters 32 to open the emitters 32 to the faceplate (not shown).

Referring to FIGS. 1 and 2, the emitters 32 are grouped into discrete emitter sets 33 in which the bases of the emitters 32 in each set are commonly connected. As shown in FIG. 2, for example, the emitter sets 33 are configured into rows (e.g., $R_1$–$R_3$) in which the individual emitter sets 33 in each row are commonly connected. Additionally, each emitter set 33 has a grid structure superjacent to the emitters that is configured into columns (e.g., $C_1$–$C_2$) in which the individual grid structures are commonly connected in each column. Such an arrangement allows an X-Y addressable array of grid-controlled emitter sets. The two terminals, comprising the emitters and the grids, of the three terminal cold cathode emitter structure (where the third terminal is understood to be the anode disposed on the faceplate [not shown in FIG. 2]) are commonly connected along such rows and columns, respectively, by means of high-speed interconnects. The interconnects 60 (also shown in FIG. 1) are formed on top of the emitter substrate 30 and the extraction grid 50, and they serve to electrically connect the individual grid structures forming the columns. It will be appreciated that the column and row assignments were chosen for illustrative purposes and can be exchanged with no loss of intellectual content.

In operation, a specific emitter set is selectively activated by producing a voltage differential between the extraction grid and the specific emitter set. A voltage differential may be selectively established between the extraction grid and a specific emitter set through corresponding drive circuitry that generates row and column signals that intersect at the location of the specific emitter set. Referring to FIG. 2, for example, a row signal along row $R_2$ of the extraction grid 50 and a column signal along a column $C_1$, of emitter sets 33 activates the emitter set at the intersection of row $R_2$ and column $C_1$. The voltage differential between the extraction grid and the selectively activated emitter sets produces localized electric fields that extract electrons from the emitters in the activated emitter sets.

The display screen of the faceplate (not shown) is coated with a substantially transparent conductive material to form an anode, and the anode is coated with a cathodoluminescent layer. The anode, which is typically biased to approximately 1.0–2.0 kV, draws the extracted electrons through the extraction grid and across a vacuum gap (not shown) between the extraction grid and the cathodoluminescent layer of material. As the electrons strike the cathodoluminescent layer, light emits from the impact site and travels through the anode and the glass panel of the display screen. The emitted light from each of the areas becomes all or part of a picture element.

One manufacturing concern with FEDs is that conventional interconnects may contact irregular, oversized protuberances located under the interconnects. Referring to FIG. 1, the interconnect 60 is conventionally formed on top of a polysilicon extraction grid 50 after the extraction grid 50 and the underlying insulator layer 40 have been planarized with a chemical-mechanical planarization ("CMP") process. A large, irregular protuberance 34 may extend to the top surface 54 of the extraction grid 50 that was created by the CMP process. As shown in FIG. 1, when the defective protuberance 34 is formed under the metal interconnect 60, the defective protuberance 34 creates a short between the interconnect 60 and the emitter substrate 30. Thus, it would be desirable to develop a baseplate and a process for making a baseplate in which the interconnects are electrically isolated from protuberances that can short the interconnect to the emitter substrate.

Another manufacturing concern with FEDs is that a voltage drop occurs across the extraction grid at each emitter set. Referring to FIG. 1, a voltage drop occurs from a point P to a point C on the extraction grid 50 because polysilicon is reasonably resistive. As a result, the emitters 32 located at the center of the emitter set 33 experience a lower potential and may emit fewer electrons than those at the perimeter of the emitter set 33. Therefore, it would be desirable to reduce the voltage drop across the extraction grid.

Still another manufacturing concern with FEDs is that several process steps are required to fabricate a conventional baseplate. In a conventional process, a baseplate is fabricated by:

(1) forming emitters on a silicon emitter substrate;

(2) depositing an oxide insulating layer over the emitters;

(3) depositing a polysilicon layer over the oxide layer to provide material for an extraction grid;

(4) planarizing the polysilicon layer and the oxide layer to form a polysilicon extraction grid with holes over the emitters, and to expose the portions of the oxide layer in the holes;

(5) patterning the polysilicon layer forming distinct addressable lines;

(6) depositing and patterning a metal layer over the planarized polysilicon extraction grid to form interconnects on the extraction grid; and (7) etching cavities in the oxide layer through the holes in the extraction grid and adjacent to the emitters to open the emitters to the holes in the extraction grid.

It will be appreciated that reducing the number of processing steps reduces the time and material costs to produce FEDs. Thus, it would also be desirable to reduce the number of steps to fabricate a baseplate.

In light of the manufacturing concerns with conventional FED baseplates and the conventional processes for fabricating baseplates, it would be desirable to develop an FED baseplate in which the interconnects are electrically isolated from protuberances under the interconnects that may project from the emitter substrate. It would further be desirable to reduce the voltage drop across an FED extraction grid at each emitter set, and to produce an FED baseplate in fewer steps.

SUMMARY OF THE INVENTION

One aspect of the present invention is a method for fabricating microelectronic devices in which a highly conductive upper layer for forming a high-speed interconnect is electrically isolated from protuberances that project from a lower conductive layer to a desired endpoint of a CMP process. In one embodiment of the method, the lower conductive layer is covered with an insulating material to form an insulator layer that generally follows the contour of the lower conductive layer and the protuberances on the lower conductive layer. A conductive material, such as a metal, is then deposited over the insulator layer to form an upper conductive layer that generally follows the contour of the insulator layer. After the upper conductive layer is deposited, the insulator layer and the upper conductive layer are planarized with a CMP process to a desired endpoint.

Importantly, since the upper conductive layer is deposited before the planarizing step, the insulator layer spaces the upper conductive layer apart from any protuberances that project from the lower conductive layer to the endpoint of the CMP process. Therefore, even when the CMP process exposes an upper portion of a protuberance, the insulator layer electrically isolates the upper conductive layer from the protuberance.

The present invention is particularly useful in the manufacturing of baseplates for FEDs. One FED baseplate in accordance with the invention has an emitter substrate upon which a plurality of emitters are formed. The emitters project away from the emitter substrate, and they are preferably configured into rows (columns) of discrete emitter sets on the emitter substrate. An insulator layer is disposed on the emitter substrate, and a plurality of cavities through the insulator layer are aligned with respective emitters. An interconnect/grid layer, which is disposed on the insulator layer, has a plurality of extraction grid segments and a plurality of interconnect sections formed integrally with one another. The interconnect/grid layer is preferably made from a material, such as a metal, with a conductivity sufficient to operate the FED with a refresh rate of 60 Hz. The extraction grid segments are preferably configured into columns (rows) that are typically orthogonal to the rows (columns) of emitter sets, and each extraction grid segment has a plurality of holes aligned with respective cavities in the insulator layer. The interconnect sections couple adjacent extraction grid segments together to form groups of commonly connected extraction grid segments. The insulator layer spaces the interconnect sections apart from any protuberances projecting from the emitter substrate to electrically isolate the interconnect sections from such protuberances.

DETAILED DESCRIPTION OF THE INVENTION

The present invention provides a conductive structure, and a method for making the conductive structure, in which an upper conductive layer is electrically isolated from protuberances that project from a lower conductive layer. An important aspect of the invention is to deposit the upper conductive layer over an insulator layer that conforms the contour of the protuberances on the lower conductive layer before the insulator layer is planarized by a CMP process. The insulator layer accordingly spaces the upper conductive layer away from the protuberances. Thus, even when a protuberance is exposed by the CMP process, the insulator layer electrically isolates the upper conductive layer from the protuberance.

The invention is applicable to forming interconnects and conductive layers in virtually any microelectronic device. It is particularly useful, however, for fabricating interconnects and extraction grids in FED baseplates. Thus, without limiting the scope of the invention, the invention will be disclosed as applied to fabricating FEDs. FIGS. 3A–7B, in which like reference numbers refer to like parts throughout the various views, accordingly illustrate FED baseplates and methods for forming FED baseplates in accordance with the invention.

Figure 1:
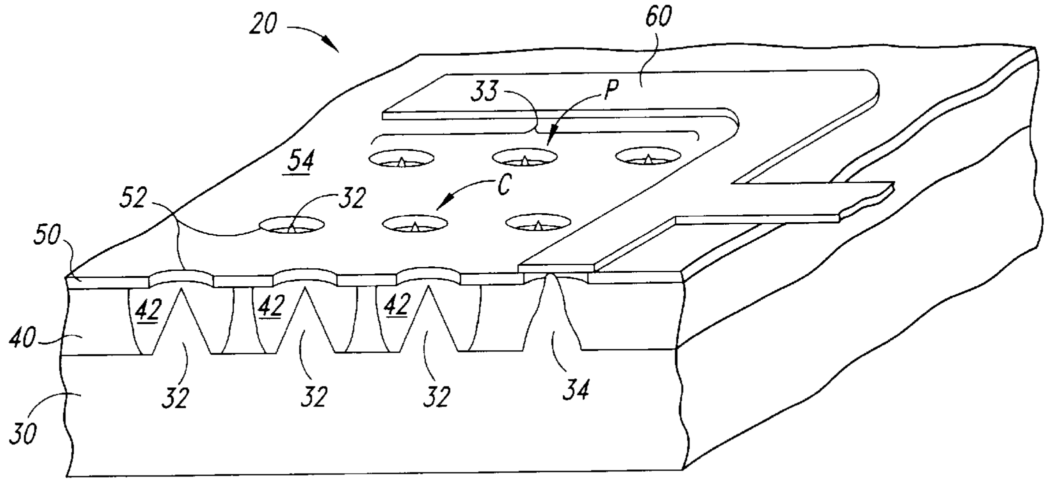
Fig. 1 (Prior Art)
FIG. 1 is a partial schematic isometric view of an FED baseplate in accordance with the prior art.
Figure 2:
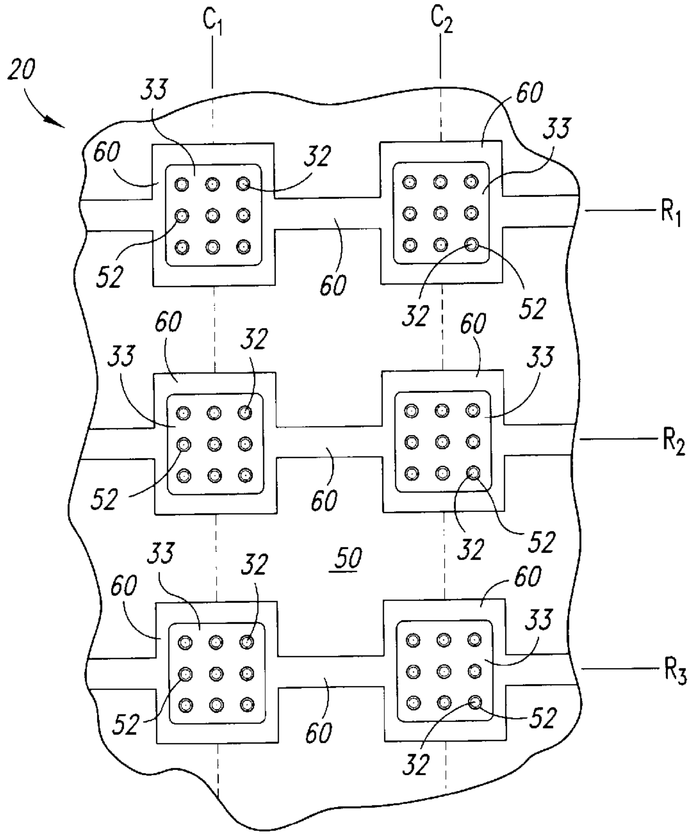
Fig. 2 (Prior Art)
FIG. 2 is a partial plan view of the FED baseplate of FIG. 1 in accordance with the prior art.
Figure 3A:
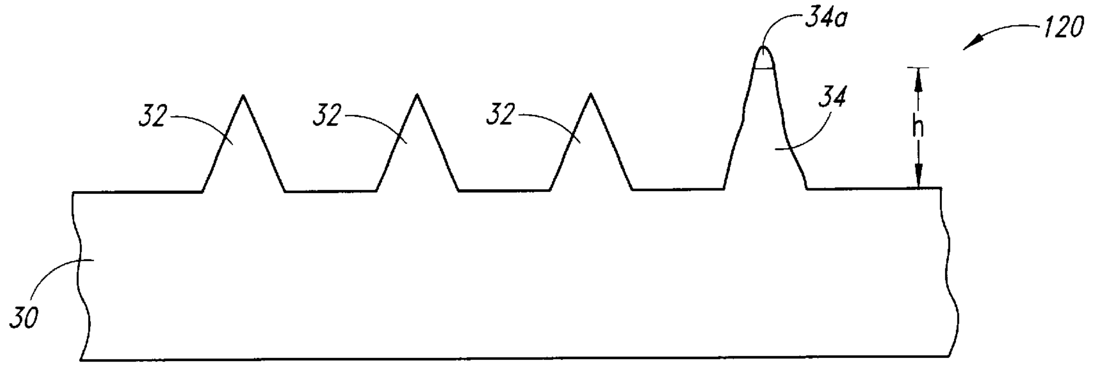
FIG. 3A is a partial schematic cross-sectional view of an FED baseplate in accordance with the invention at one point in a method for making the baseplate.
Figure 3B:
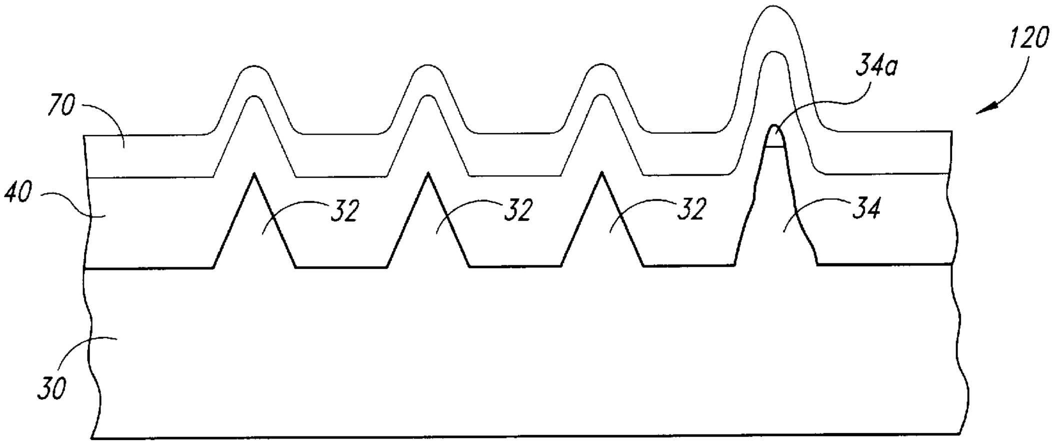
FIG. 3B is a partial schematic cross-sectional view of the FED baseplate of FIG. 3A at another point in a method for making the baseplate.
Figure 3C:
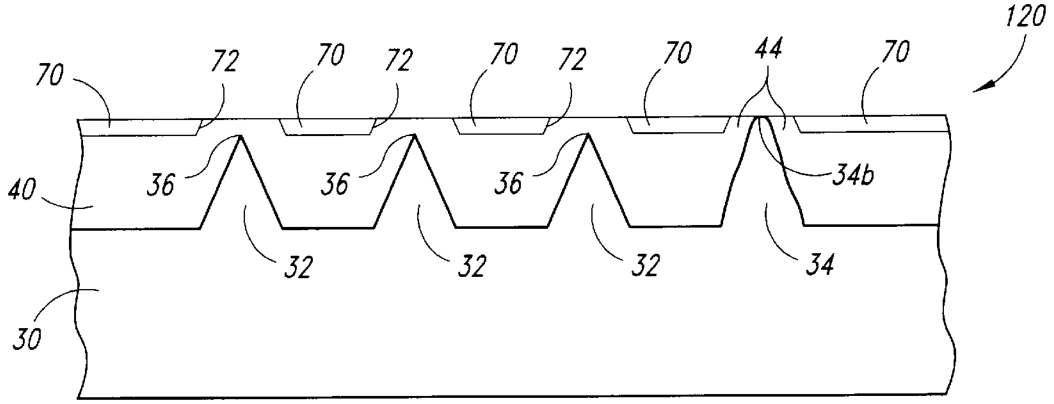
FIG. 3C is a partial schematic cross-sectional view of the FED baseplate of FIG. 3B at another point in a method for making the baseplate.

FIGS. 3A–3C illustrate a method for forming an FED baseplate 120 in accordance with the invention. FIG. 3A illustrates an initial step of the method in which a plurality of emitters 32 are formed on an emitter substrate 30. The emitters 32 are preferably grouped into discrete emitter sets, and the emitter sets are preferably configured into columns or rows on the emitter substrate 30, as discussed above with respect to FIG. 2. The emitters 32 are preferably conical-shaped protuberances that project upwardly from the emitter substrate 30 towards a faceplate (not shown). The shape of the emitters 32, however, is not limited to conical protuberances and may be any other suitable shape. As may occur in the formation of the emitters 32, a large false-emitter defect 34 may also be formed on the emitter substrate 30. The false-emitter defect 34 has an upper portion 34(*a*) extending above desired maximum height h for features on the emitter substrate 30. The emitter substrate 30 is typically made from conductive silicon, and thus the emitters 32 and the defective false-emitter defect 34 are conductive elements. Alternatively, the emitters 32 may be formed from a conductive layer (not shown) that was deposited on an insulating substrate such as glass. Likewise, the false tip defect 34 may be comprised of this conductive layer having been unintentionally fabricated with the intended emitters 32. The false tip defect may also originate from the substrate itself and simply be conformally covered by the conductive emitter layer yielding an equivalently deleterious false tip defect 34.

FIG. 3B illustrates a subsequent stage in the method for forming the FED baseplate 120. After the emitters 32 are formed on the emitter substrate 30, an insulator layer 40 is deposited over the emitter substrate 30 so that the insulator layer 40 generally conforms to the contour of the emitters 32 and the false-emitter defect 34. A unitary interconnect/grid layer 70, which is preferably made from a material having a conductivity sufficient to operate the FED at a refresh rate of 60 Hz, is then deposited over the insulator layer 40. Suitable materials from which the interconnect/grid layer 70 may be made include, but are not limited to, aluminum, copper, or tungsten. The interconnect/grid layer 70 is preferably deposited to a thickness of 0.5 to 5.0 $\mu$m. Since, the interconnect/grid layer 70 is deposited over the insulator layer 40 before the insulator layer 40 is planarized with a CMP process, the interconnect/grid layer 70 generally conforms to the contour of the insulator layer 40.

The actual conductivity of the interconnect/grid layer 70 depends upon several factors, some of which are: (1) the current draw of the emitters; (2) the inductance and capacitance of the extraction grid; (3) the shape and size of the extraction grid; (4) the number of grey scales of the display; and (5) the color spectrum of the display. In a specific example, which is not intended to limit the scope of the invention, the conductivity value of the interconnect/grid layer 70 is preferably less than or equal to 500 $(\text{ohm-cm})^{-1}$ for a display with the following parameters: (1) an active display area of 12.1 inches as measured across the diagonal; (2) a VGA resolution (640×480 lines); (3) full-on spatial color RGB display format supporting 256 grey scales; (4) a refresh rate of 60 Hz; and (5) a passive drive scheme with horizontal rows addressing the interconnect/grid layer and vertical columns addressing the emitters. In general, since the intersection of an addressed row and column activates the emitters at that particular pixel and the length of time that the emitters are biased controls the grey scale of the particular pixel, the interconnect/grid layer 70 is made from a material having a minimum conductivity sufficient to transmit signals to substantially all commonly connected grid segments with a refresh interval of at least approximately 10–40 $\mu$sec.

FIG. 3C illustrates the baseplate 120 after the interconnect/grid layer 70 and insulator layer 40 have been planarized with a CMP process. To CMP the interconnect/grid layer 70 and the insulator layer 40, the front side of the baseplate 120 is pressed against a chemical-mechanical planarization polishing pad in the presence of a slurry under controlled chemical, pressure, velocity and temperature conditions. The slurry generally contains small, abrasive particles that abrade the front face of the baseplate, and chemicals that etch and/or oxidize the materials on the front face of the baseplate. The polishing pad is generally a planar pad made from a continuous phase matrix material, and abrasive particles may be suspended in the matrix material. Thus, when the pad and/or the baseplate move with respect to the other, material is removed from the front surface of the baseplate mechanically by the abrasive particles and chemically by the etchants and/or oxidants.

The CMP process is endpointed so that a number of holes or openings 72 are formed in the interconnect/grid layer 70 over the emitters 32 without exposing the tips 36 of the emitters 32. At the endpoint of the CMP process, therefore, a sufficient amount of material is removed to expose the upper portion 34(*a*) of the false-emitter defect 34 (shown in FIGS. 3A and 3B). Importantly, the insulator layer 40 spaces the interconnect/grid layer 70 from a remaining portion 34(*b*) of the false-emitter defect 34.

Figure 4:
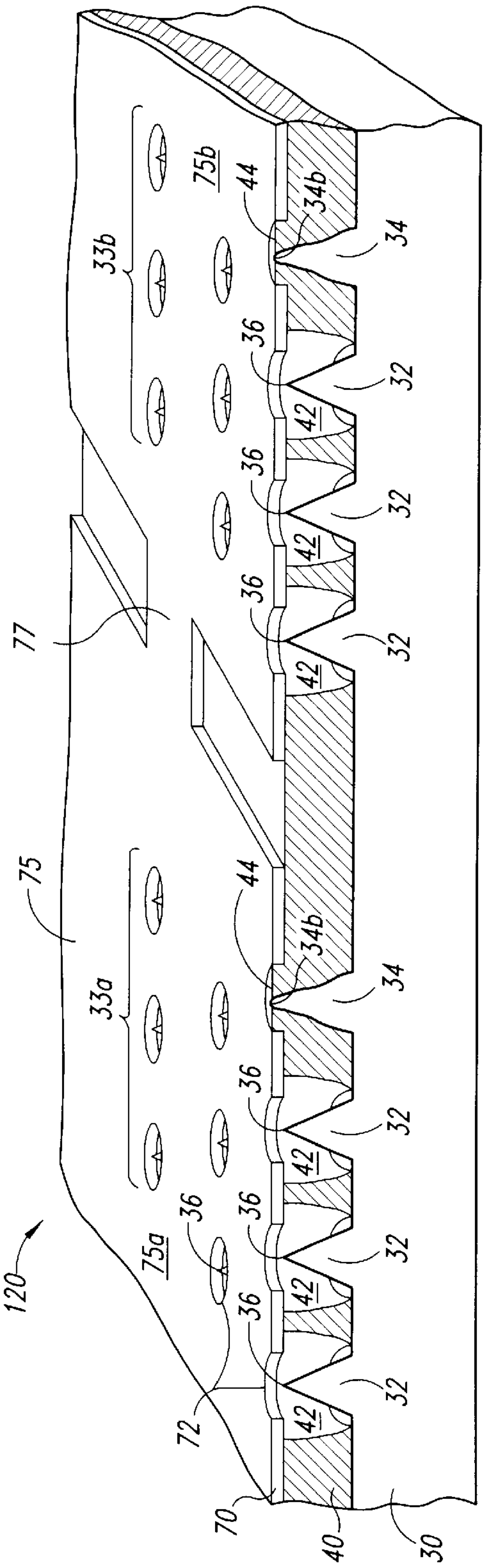
FIG. 4 is an partial isometric view of the of the FED baseplate of FIG. 3C.

FIG. 4 illustrates a completed baseplate 120 with a number of cavities 42 formed in the insulator layer 40 adjacent to the emitters 32. The cavities 42 are preferably formed by a wet etch process that is selective to the material of the insulator layer 40. Before the insulator layer 40 is etched, the false-emitter defect 34 is preferably covered by patterning a resist material (not shown) over the false-emitter defect 34 to prevent the portion of the insulator layer 40 adjacent to the false-emitter defect 34 from being removed when the cavities 42 are formed. Thus, the insulator layer 40 forms a spacer 44 in the hole or opening 72 between the truncated tip of the false-emitter defect 34 and the interconnect/grid layer 70.

Still returning to FIG. 4, both an extraction grid 75 and an interconnect 77 are formed integrally with each other from the interconnect/grid layer 70. FIG. 4 only illustrates a portion of two emitter sets 33(*a*) and 33(*b*) over which the extraction grid 75 includes extraction grid segments 75(*a*) and 75(*b*), respectively. The interconnect 77 is thus the portion of the interconnect/grid layer 70 between the extraction grid segments 75(*a*) and 75(*b*). It will be appreciated that the FED baseplate 120 has a large number of emitter sets and corresponding number of extraction grid segments that are preferably configured into rows and columns on the emitter substrate 30. Thus, there are also a large number of interconnects 77 to couple neighboring extraction grid segments together to form commonly connected rows and/or columns of extraction grid segments.

One advantage of the FED baseplate 120 is that the interconnects 77 are electrically isolated from any protuberances that project from the emitter substrate 30. An important aspect of the invention is that the interconnect/grid layer 70 from which the interconnects 77 are formed is deposited over the insulator layer 40 before the insulator layer 40 is planarized by a CMP process. Moreover, a central aspect of this particular embodiment of the invention is that both the extraction grid 75 and the interconnects 77 are formed integrally with each other from an interconnect/grid layer 70 made from a material with a sufficiently high conductivity to form high-speed interconnects. The insulator layer 40 accordingly forms a spacer 44 around the remaining portion 34(*b*) of the false-emitter defect 34 that electrically isolates the interconnect 77 from the false-emitter defect 34. Therefore, compared to conventional baseplates in which the material for the interconnect is deposited after the false-emitter is exposed by the CMP process, the baseplate 120 of the present invention substantially eliminates shorts between the interconnects 77 and the emitter substrate 30.

Another advantage of the present invention is that it reduces the voltage drop across the extraction grid 75. Unlike conventional extraction grids made from polysilicon, the extraction grid 75 of the baseplate 120 is made from a highly conductive material that preferably has a conductivity sufficient to operate the FED with a refresh rate of 60 Hz. Thus, the emitters at the center of an emitter set emit substantially the same volume of electrons as those at the perimeter of the emitter set.

Still another advantage of the present invention is that the FED baseplate 120 may be fabricated with fewer process steps than conventional FED baseplates. Unlike the fabrication process for conventional baseplates, the present invention eliminates the deposition of a polysilicon layer over an oxide layer to provide material for the extraction grid 75. In this embodiment of the invention, the extraction grid 75 is made from the same interconnect/grid layer 70 used to form the interconnects 77. Therefore, this embodiment of the present invention reduces the number of steps to fabricate an FED baseplate.

Figure 5:
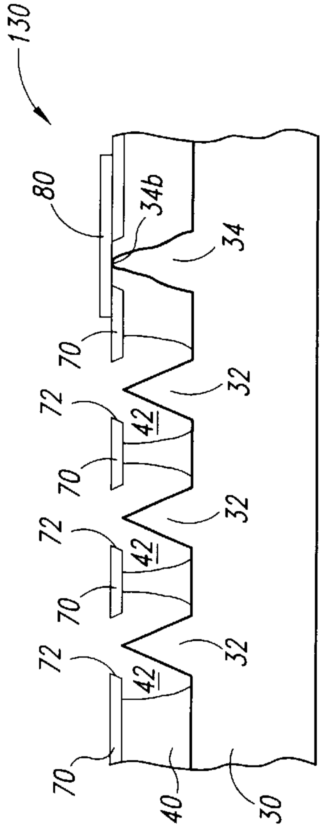
FIG. 5 is a partial schematic cross-sectional view of another FED baseplate in accordance with the invention.

FIG. 5 illustrates another FED baseplate 130 in accordance with the invention in which a passivation layer 80 is deposited over the exposed false-emitter defect 34. The passivation layer 80 is preferably deposited onto the surface of the baseplate 130 before the insulator layer 40 is etched to form the cavities 42 (shown in FIG. 3C). The passivation layer 80 may be made from a dielectric material, such as silicon dioxide, but it may also be made from any other suitable insulative material used in the semiconductor arts. The passivation layer 80 further inhibits surface leakage between the false-emitter defect 34 and the grid/interconnect layer 70.

Figure 6A:
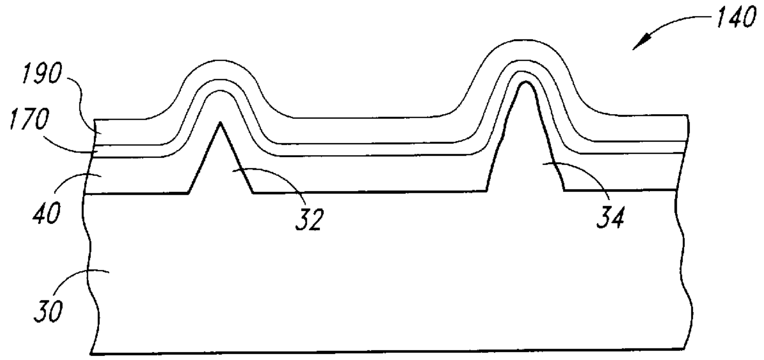
FIG. 6A is a partial schematic cross-sectional view of another FED baseplate in accordance with the invention at one point in a method for making the baseplate.
Figure 6B:
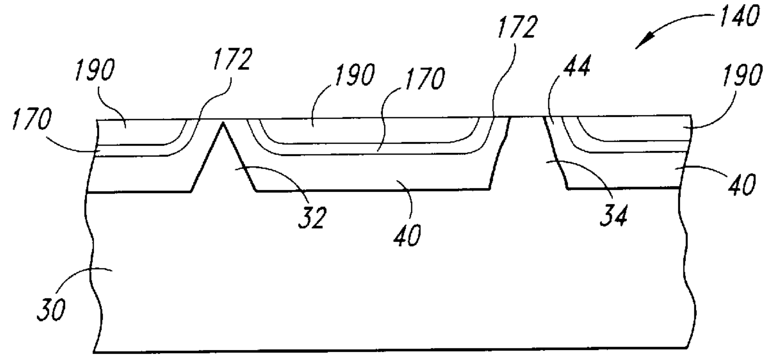
FIG. 6B is a partial schematic cross-sectional view of the FED baseplate of FIG. 6A at another point in a method for making the baseplate.
Figure 6C:
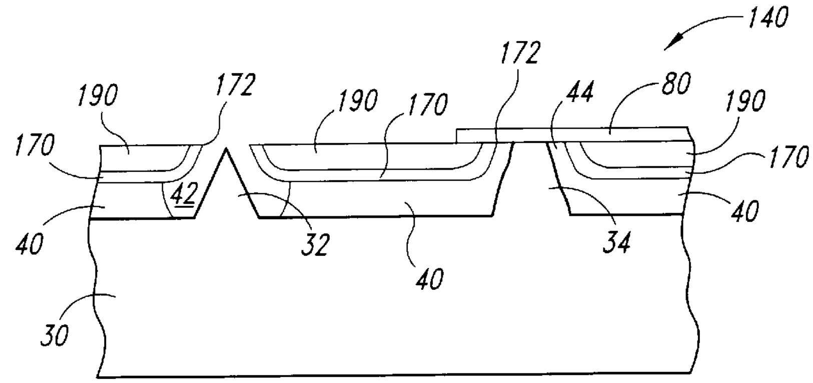
FIG. 6C is a partial schematic cross-sectional view of the FED baseplate of FIG. 6B at another point in a method for making the baseplate.

FIGS. 6A–6C illustrate another method for making an FED baseplate 140 in accordance with the invention. FIG. 6A illustrates the baseplate 140 at a relatively early stage in the method. As discussed above with respect to FIGS. 3A and 3B, a number of emitters 32 and a false-emitter defect 34 are formed on an emitter substrate 30. An insulator layer 40 is deposited over the emitter substrate 30, and an interconnect/grid layer 170 is deposited over the insulator layer 40. Unlike the interconnect/grid layer 70 of the baseplate 120 shown in FIGS. 3A–3C, the interconnect/grid layer 170 of the baseplate 140 is made from a relatively hard material such as chrome, molybdenum, or other refractory metals. A polishing layer 190 is accordingly deposited over the hard interconnect/grid layer 170 to provide a CMP polishing medium that enhances the uniformity of the planarized surface of the baseplate 140. The polishing layer 190 is preferably made from polysilicon, silicon dioxide, silicon nitride, or any other suitable polishable material.

FIG. 6B illustrates the baseplate 140 after it has been planarized by a CMP process. One desirable CMP process for forming self-aligned gate structures around emitters is disclosed in U.S. Pat. No. 5,229,331, entitled "A Method to Form Self-Aligned Gate Structures Around Cold-Cathode Emitter Tips Using CMP," which is herein incorporated by reference. During the CMP of the baseplate 140, the polishing pad (not shown) initially removes the portions of the polishing layer 190 over the peaks created by the emitters 32 without removing much of the material from the surface of the polishing layer 190 in the depressions between the peaks. The upper surface of the polishing layer 190 in the depressions between peaks, therefore, is nearly the original upper surface of the polishing layer 190. Thus, the polishing layer 190 provides a shoulder between the peaks to support the polishing pad and produce a more uniformly planar surface.

Still referring to FIG. 6B, the planarized surface of the baseplate 140 produces a number of holes 172 in the hard interconnect/grid layer 170 and a number of apertures 192 through the polishing layer 190 that are substantially aligned with the emitters 32 and the false-emitter defect 34. As with the soft interconnect/grid layer 70 of the baseplate 120, an extraction grid and interconnects are formed from the hard interconnect/grid layer 170. Also as with the baseplate 120, the insulator layer 40 electrically isolates the hard interconnect/grid layer 170 from the false-emitter defect 34.

FIG. 6C illustrates another embodiment of the baseplate 140 in which a passivation layer 80 is deposited over the false-emitter defect 34. The passivation layer 80 further prevents surface current between the false tip 34 and the grid/interconnect 155.

Figure 7A:
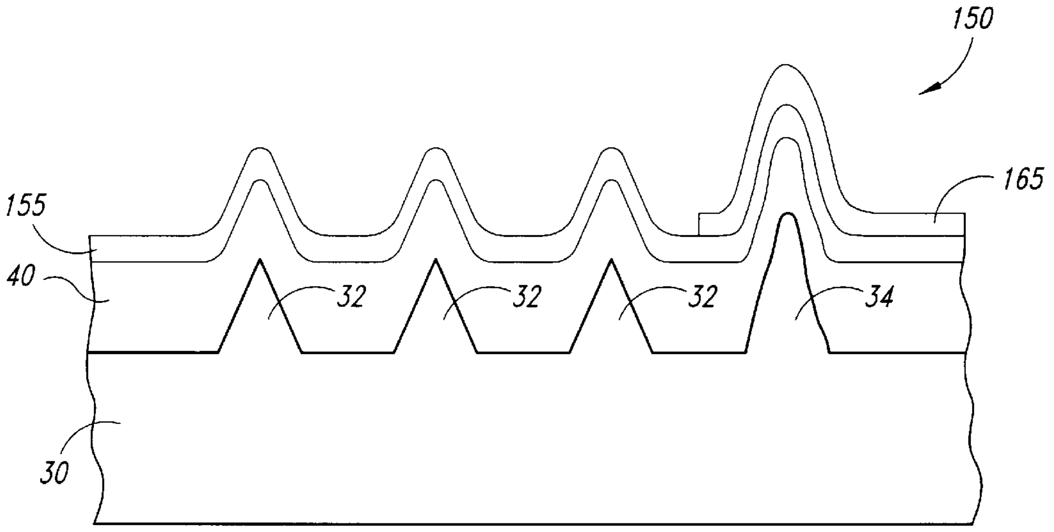
FIG. 7A is a partial schematic cross-sectional view of another FED baseplate in accordance with the invention at a point in a method for making the baseplate.
Figure 7B:
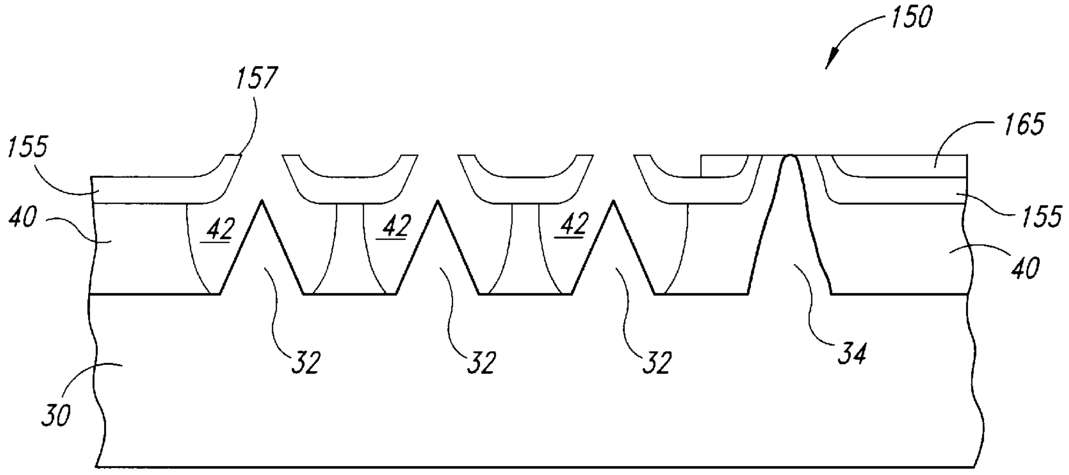
FIG. 7B is a partial schematic cross-sectional view of the FED baseplate of FIG. 7A at another point in a method for making the baseplate.

FIGS. 7A and 7B illustrate another FED baseplate 150 in accordance with the invention. FIG. 7A illustrates the baseplate 150 before a film stack on top of the emitters 32 and the false-emitter defect 34 is planarized by a CMP process. At this point in the fabrication of the baseplate 150, an insulator layer 40 is deposited over the emitter substrate 30, an intermediate conductive layer 155 is deposited over the insulator layer 40, and an upper conductive layer 165 is deposited over at least part of the intermediate conductive layer 155. The intermediate conductive layer 155 is preferably made from polysilicon or a soft metal, and the upper conductive layer is made from a highly conductive metal.

FIG. 7B illustrates the FED baseplate 150 after it has been planarized with a CMP process and etched with a wet etch process. The CMP process forms a number of holes 157 in the intermediate conductive layer 155, and the etch process forms the cavities 42 in the insulator layer 40 adjacent to the emitters 32. Thus, after the CMP and wet etch processes, the intermediate conductive layer 155 forms an extraction grid and the upper conductive layer 165 forms an interconnect. Importantly, the interconnect formed from the upper conductive layer 165 is electrically isolated from the false-emitter defect 34 because it was deposited onto the baseplate 150 before the film stack was planarized.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method for fabricating a baseplate in the manufacturing of a field emission display, comprising:

covering an emitter substrate having a plurality of emitters projecting from the emitter substrate to an emitter tip elevation with an insulating material to form an insulator layer, the insulator layer generally conforming to the emitter substrate and the emitters;

depositing a single, metal interconnect/grid layer over the insulator layer to generally conform to the insulator layer and the emitters;

planarizing the interconnect/grid layer with a chemical-mechanical planarization method to an endpoint at which holes are formed in the interconnect/grid layer over the emitters at an elevation above the emitter tip elevation; and selectively removing portions of the insulator layer in the holes of the interconnect/grid layer and adjacent to the emitters to form cavities that expose the emitters.

2. The method of claim 1 wherein the emitter substrate further includes a defective protuberance having a peak at an elevation above the emitter tip elevation, and wherein planarizing the interconnect/grid layer comprises removing material from the interconnect/grid layer and the insulator layer to form a planarized surface at an elevation above the emitter tip elevation and below the peak of the protuberance, a portion of the protuberance being exposed at the planarized surface.

3. The method of claim 2, further comprising fabricating a passivation layer over the exposed portion of the defective protuberance.

4. The method of claim 1 wherein the interconnect/grid layer is composed of aluminum.

5. The method of claim 1 wherein the interconnect/grid layer is composed of copper.

6. The method of claim 1 wherein the interconnect/grid layer is composed of tungsten.

* * * * *

UNITED STATES PATENT AND TRADEMARK OFFICE

CERTIFICATE OF CORRECTION

PATENT NO. : 6,010,917
DATED : January 4, 2000
INVENTOR(S) : James J. Alwan, Kevin Tjaden and David A. Cathey It is certified that error appears in the above-identified patent and that said Letters Patent is hereby corrected as shown below:

Title page,
Item [57] ABSTRACT, line 1, "deices" should read -- devices --
Add a new section:
-- STATEMENT AS TO GOVERNMENT RIGHTS This invention was made with United States Government support under Contract No. DABT63-93-C-0025 awarded by the Advanced Research Projects Agency (ARPA). The United States Government has certain rights in this invention. --

Signed and Sealed this

Eighth Day of January, 2002

*Attest:*

JAMES E. ROGAN

*Attesting Officer* *Director of the United States Patent and Trademark Office*